United States Patent
Calmidi et al.

(10) Patent No.: US 6,665,186 B1
(45) Date of Patent: Dec. 16, 2003

(54) LIQUID METAL THERMAL INTERFACE FOR AN ELECTRONIC MODULE

(75) Inventors: Varaprasad V. Calmidi, Vestal, NY (US); Eric A. Johnson, Greene, NY (US); Randall J. Stutzman, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/280,642

(22) Filed: Oct. 24, 2002

(51) Int. Cl.⁷ ................................................. H05K 7/20
(52) U.S. Cl. ..................... 361/704; 361/705; 361/708; 361/699; 257/706; 257/714; 165/80.4
(58) Field of Search .............................. 361/704, 707, 361/699; 257/706, 714, 687; 174/15.1; 165/80.4, 185

(56) References Cited

U.S. PATENT DOCUMENTS

| | | | |
|---|---|---|---|
| 4,323,914 A | 4/1982 | Berndlmaier et al. | 357/82 |
| 4,607,277 A | 8/1986 | Hassan et al. | 357/81 |
| 4,915,167 A | 4/1990 | Altoz | 165/185 |
| 4,920,574 A | 4/1990 | Yamamoto et al. | 361/385 |
| 5,006,924 A * | 4/1991 | Frankeny et al. | 257/714 |
| 5,056,706 A | 10/1991 | Dolbear et al. | 228/180.2 |
| 5,198,189 A | 3/1993 | Booth et al. | 420/555 |
| 5,323,294 A * | 6/1994 | Layton et al. | 361/699 |
| 5,365,402 A * | 11/1994 | Hatada et al. | 361/699 |
| 5,561,590 A * | 10/1996 | Norell et al. | 361/699 |
| 6,019,509 A | 2/2000 | Speckbrock et al. | 374/201 |
| 6,343,647 B2 | 2/2002 | Kim et al. | 165/185 |
| 6,392,890 B1 * | 5/2002 | Katchmar | 361/705 |

FOREIGN PATENT DOCUMENTS

| JP | 60084848 A * | 5/1985 | H01L/23/36 |
|---|---|---|---|

OTHER PUBLICATIONS

IBM Technical Disclosure Bulletin, Jan., 1977, US, vol. 19, Issue 8, p. 3127.*
IBM Technical Disclosure Bulletin, Apr. 1978, US, vol. 20, Issue 11B, pp. 4817–4818.*
IBM Technical Disclosure Bulletin, Apr. 1978, US, vol. 20, Issue 11B, pp. 4820–4822.*
IBM Technical Disclosure Bulletin, Mar., 1979, US, vol. 21, Issue 10, pp. 4125–4126.*
IBM Technical Disclosure Bulletin, Jul. 1979, US, vol. 22, Issue 2, pp. 602–605.*
IBM Technical Disclosure Bulletin, Sep. 1979, US, vol. 22, Issue 4, p. 1553.*
IBM Technical Disclosure Bulletin, Apr. 1982, US, vol. 24, Issue 11A, pp. 5625–5626.*
IBM Technical Disclosure Bulletin entitled "Thermal Enhancement of Modules", Jan. 1977.
IBM Technical Disclosure Bulletin entitled "Circuit Module with Gallium Metal Cooling Structure", Sep. 1976.
IBM Technical Disclosure Bulletin entitled "Cooling Structure for an Integrated Circuit Module", Jul. 1980.
ChemGlobe, Periodic Table of the Elements, "Gallium", dated Aug. 6, 2002.
Reade Advanced Materials, "NewMerc Alloys", dated Aug. 6, 2002.
Abstract, "Liquid Metal Current Limiters", by A. Kratzschmar et al.

* cited by examiner

*Primary Examiner*—Boris Chervinsky
(74) *Attorney, Agent, or Firm*—James A. Lucas; Driggs, Lucas, Brubaker & Hogg Co., LPA

(57) ABSTRACT

A heat dissipating system utilizes a thin layer of a high conductivity liquid metal to provide cooling for electronic sub-assemblies, such as semiconductor chips. The liquid metal preferably is gallium or its alloy which transfers heat from the chip to a heat sink or heat spreader. The system includes one or more vents that allow for filling and venting of the space occupied by the liquid. It also utilizes a flexible seal, such as an O-ring or a membrane held in place with a retainer ring, or a plug that seals the filling vent. The seal flexes to accommodate expansion and contraction of the liquid, as well as phase changes from the liquid phase to the solid phase.

22 Claims, 4 Drawing Sheets

LIQUID METAL THERMAL INTERFACE FOR AN ELECTRONIC MODULE

FIELD OF THE INVENTION

This invention relates to the field of electronic packaging. More specifically, the invention relates to efficient heat transfer systems, particularly useful for dissipating heat from a power source, such as an integrated circuit chip in an electronic structure, to a heat sink.

BACKGROUND OF THE INVENTION

In semiconductor technology, as applied to integrated circuit chip devices, it is important to provide suitable means to dissipate the heat that is generated within the chip so as to minimize the possible adverse effects of overheating, such as dimensional variations, variable operating characteristics and differential thermal expansion. Ineffective cooling of such devices results in decreased permissible power density, circuit density and system speed.

Whenever it is desired to dissipate heat from a source to a sink by conduction, an important aspect of the transfer is the amount of actual contact between the source and the heat sink. Regardless of the smoothness of the abutting surfaces and the amount of pressure that is employed to urge the surfaces together, there inevitably are irregularities that create air gaps between the adjoining surfaces. The presence of these gaps in the interface tends to increase the resistance to the flow of heat from the source to the sink inasmuch as air is considered a poor thermal conductor. The thermal resistance of an interface between two surfaces can be reduced by providing an interface material which fills the air gaps and voids in the surfaces. Many different structures have been used to transfer heat between two surfaces. Examples used in electronic packaging include adhesives that attach O-rings or heat sinks to chips, greases disposed between the surfaces, solder directly attaching the surfaces, and deformable pads clamped between the surfaces. In every case, the desire is to minimize the interfacial thermal resistance and to maximize the thermal conductivity of the transferring medium. Typical values for the effective thermal conductivity in electronic packaging are 0.2 to 2 W/m-K (SI Units).

An ideal medium for transferring heat from one surface to another should have low interfacial thermal resistance and high conductivity. Liquids have low interfacial resistance because they wet a surface forming a continuous contact with a large area. Most liquids do not, however, have very high conductivity. Solids, and in particular metals, have very high conductivity but high interfacial resistance. Most common heat transfer materials combine highly conductive particles with a liquid or plastic in order to exploit both characteristics. Examples of the former are greases and gels while the latter include filled epoxies, silicones and acrylics.

Greases have been developed that have conductivities as high as 3.8 W/m-K which is significantly better than the corresponding conductivities of filled adhesives. Typical problems with greases include pumping and dry out, both of which can cause the conducting medium to lose contact with one or both of the heat transfer surfaces. Pumping occurs when the structure is deformed, due to differential thermal expansion or mechanical loads, and the grease is extruded. The oils contained in a grease can be depleted by evaporation or by separation and capillary flow.

Liquid metals, such as mercury and alloys of gallium, potentially offer both low interfacial resistance and high conductivity. Mercury is a well-known biological hazard, making it unsuitable for high-volume commercial use; however, this is not the case with gallium and its alloys. Several alloys of gallium with very low melting points have been identified as potential liquid metal interface materials. The most important properties of these alloys are tabulated below. Both solidus and liquidus temperatures are listed for non-eutectic alloys. The conductivity is typically about 20 times better than adhesives, such as GE 3281 silicone currently in use.

TABLE I

| Commercial name | Composition | Melting point (° C.) | Linear CTE (ppm/° C.) | Conductivity (W/m-K) |
|---|---|---|---|---|
| Gallium | Ga | 29.8 | 120 | 40.6 |
| Indalloy 60 | GaIn - 75.5/24.5 | 16 | 180 (est.) | 51 (est.) |
| NewMerc | Proprietary alloys of Ga, In, Sn, Bi, Zn, Cu | −11 | | 75 |
| | GaInSn - 66/20.5/13.5 | 10.5 | | 35 |
| Indalloy 51 | GaInSn - 62.5/21.5/16 | 11 | 180 (est.) | 54 (est.) |
| Indalloy 46 | GaInSnZn - 61/25/13/1 | 7 to 8 | 180 (est.) | 55 (est.) |
| Galinstant | GaInSn - 68.5/21.5/10 | −19 | 180 (est.) | 54 (est.) |

The safety data sheet for the Galinstan alloy and the toxicological certificate from Eberhard-Karls University, Tubingen, "confirm that there is no danger to man or the environment." It is commonly used as a mercury replacement in thermometers and tilt switches.

There are several U.S. patents that teach the use of a liquid metal to transfer heat from a chip to an O-ring or heat sink. While these teach the containment of the liquid metal by an adhesive, none of them teach the use of an expansion chamber or a seal. Some of these patents are listed below.

U.S. Pat. No. 4,915,167 "Thermal Coupling to Enhance Heat Transfer", 1990.

U.S. Pat. No. 5,198,189 "Liquid Metal Matrix Thermal Paste", 1993.

U.S. Pat. No. 6,019,509 "Low Melting Galluim, Indium and Tin Eutectic Alloys and Thermometers Employing Same", 2000.

U.S. Pat. No. 6,343,647 "Thermal Joint and Method of Use", 2002.

The ability to contain an electrically conductive liquid within an electronic package presents significant challenges. The liquid must be reliably retained in its enclosure throughout the life of the package if shorting is to be avoided. In addition, air must be excluded from the space between the heat transfer surfaces if the effective resistance is to be minimized. This is difficult due to the volume expansion of the liquid and is exacerbated if the metal changes between the liquid and the solid state within the temperature range of the package.

BRIEF DESCRIPTION OF THE INVENTION

The present invention describes how to accommodate the volume change of a heat transfer liquid and how to eliminate air from the cavity after it is filled with the liquid.

Disclosed herein is a structure that gives substantially lower effective thermal resistance between two surfaces. A liquid metal, such as gallium or an alloy of gallium and indium, is used. Such liquids have very low interfacial resistance and high conductivity. Furthermore, they are nontoxic and environmentally benign. The liquid metal fills a cavity that is defined by two substantially parallel surfaces and by a material, such as an epoxy or silicone, disposed between them. Changes in the liquid volume, and changes of state from liquid to solid, are accommodated by an elastomeric plug with a diaphragm that also allows filling of the cavity between the two surfaces. Vent holes may be added to aid in filling. Such a structure can have thermal conductivities as high as 30 W/m-K.

More specifically, the invention relates to a thermal coupling device for facilitating heat transfer between generally parallel surfaces having a temperature differential between the two surfaces. The device comprises a metal that is liquid over substantially the entire range of temperatures that form the temperature differential. It also includes a seal to contain the liquid metal between the two surfaces. The seal includes means for accommodating changes in the spacing between the two surfaces and volumetric changes of the metal. The seal typically comprises a flexible elastomeric or polymeric material. It can be in the shape of an O-ring seal that is retained in an annular opening of one of the surfaces. Alternatively, it can comprise a flexible membrane and a retaining ring to retain the membrane in an annular opening in one of the surfaces. In either event, the seal may contain or include one or more vent holes. The parallel surfaces can comprise a surface of a semiconductor chip and a surface of a heat sink or a heat spreader.

The invention also relates to an electronic structure that comprises an integrated circuit associated with a semiconductor chip wherein the chip generates thermal heat when in use. A heat absorber is used for removing the generated heat from an exposed surface of the chip. The heat absorber may be a heat sink or a heat spreader. The heat absorber is adjacent but spaced a small distance (typically about 0.9 mm) from the exposed surface of the chip. A metal that is liquid over substantially the entire range of temperatures that are encountered during normal use of the structure is utilized as the heat transfer medium. Examples of the metals are gallium and its alloys. A seal is used to contain the liquid metal between the two surfaces, said seal including means for accommodating changes in the spacing between the two surfaces and volumetric changes of the metal. This seal comprises a flexible elastomeric or polymeric material. The elastomeric or polymeric material may contain at least one vent hole. The seal may comprise an O-ring that is retained in an annular opening of one of the surfaces. Alternatively, it may comprise a flexible membrane, with a metal or hard polymeric retaining ring being used to hold the membrane in an annular opening of one of the surfaces.

The invention also relates to a method of transferring heat between two substrates, such as a semiconductor chip and a heat sink or heat spreader having a temperature differential between them, and having generally parallel, opposing, spaced apart surfaces. The method comprises the steps of a) confining the space between the two surfaces;

b) introducing a liquid metal into the space between the surfaces;

c) displacing all of the air in the space; and d) providing a flexible seal to contain the liquid metal and to permit expansion and contraction of the metal without affecting the spaced relationship of the two substrates. The seal comprises a flexible elastomeric or polymeric material, such as an O-ring seal that is retained in an annular opening of one of the surfaces. Alternatively, the seal may comprise a flexible membrane, and a retaining ring to hold the membrane in an annular opening of one of the surfaces. The seal typically contains at least one vent hole for displacement of the air. This vent hole is sealed after the air is displaced.

DETAILED DESCRIPTION OF THE INVENTION

Figure 1:
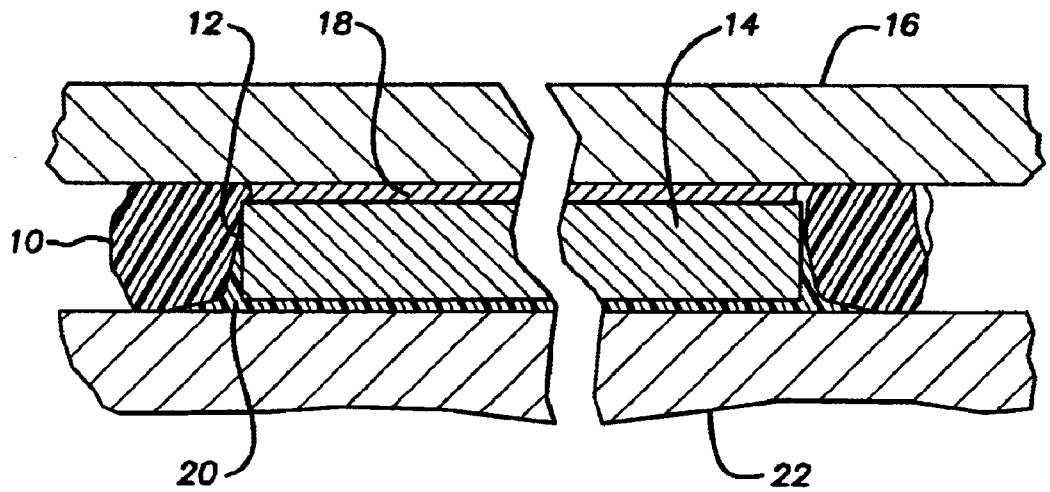
FIG. 1 is an elevational view in cross section of a semiconductor chip assembly.
Figure 2:
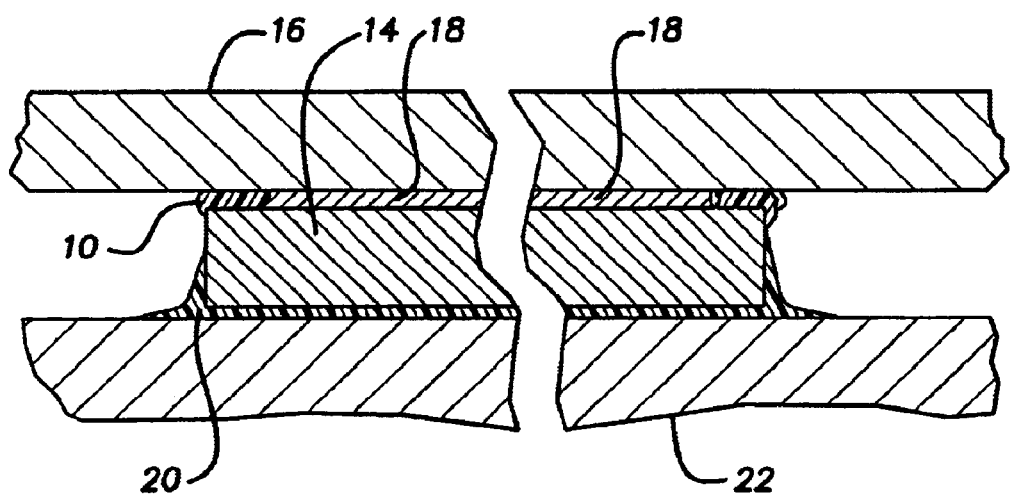
FIG. 2 is another elevational view of a semiconductor chip assembly.

FIGS. 1 and 2 show two means of defining the cavity between the two heat transfer surfaces. Shown are a semiconductor chip 14 joined to an electronic substrate 22 by a suitable underfill material 20, such as an epoxy resin. In FIG. 1, a bead 10 of an adhesive, preferably but not limited to silicone, is dispensed around the periphery 12 of the chip 14, and the O-ring 16 or heat sink is brought into contact with the bead. Some of the adhesive may be extruded onto the top of the chip and, in some areas, it may not fully cover the chip's underfill material 20. It is only necessary to form a completely enclosed volume for the liquid metal with no exposed circuitry that could be shorted.

FIG. 2 shows the adhesive bead 10 dispensed directly onto the top of the chip 14. This approach can be used for any two flat surfaces, such as between a heat sink and an O-ring. A liquid metal 18 fills the cavity between the chip 14 and the heat spreader 16. As before, the chip 14 is coupled to a substrate 22 by an underfill material 20, such as an epoxy resin. The resin minimizes stresses in the chip and the substrate due to differences (if any) in thermal expansion and contraction of these components. The substrate 22 may be an integrated circuit or other electronic module with or without associated circuitry.

Figure 4:
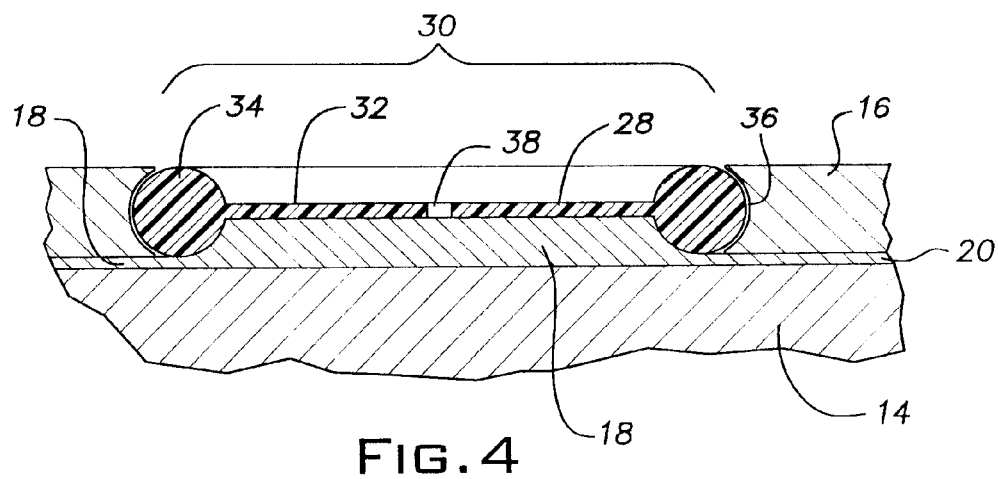
FIG. 4 is a cross-sectional view taken along lines 4—4 of FIG. 3.
Figure 3:
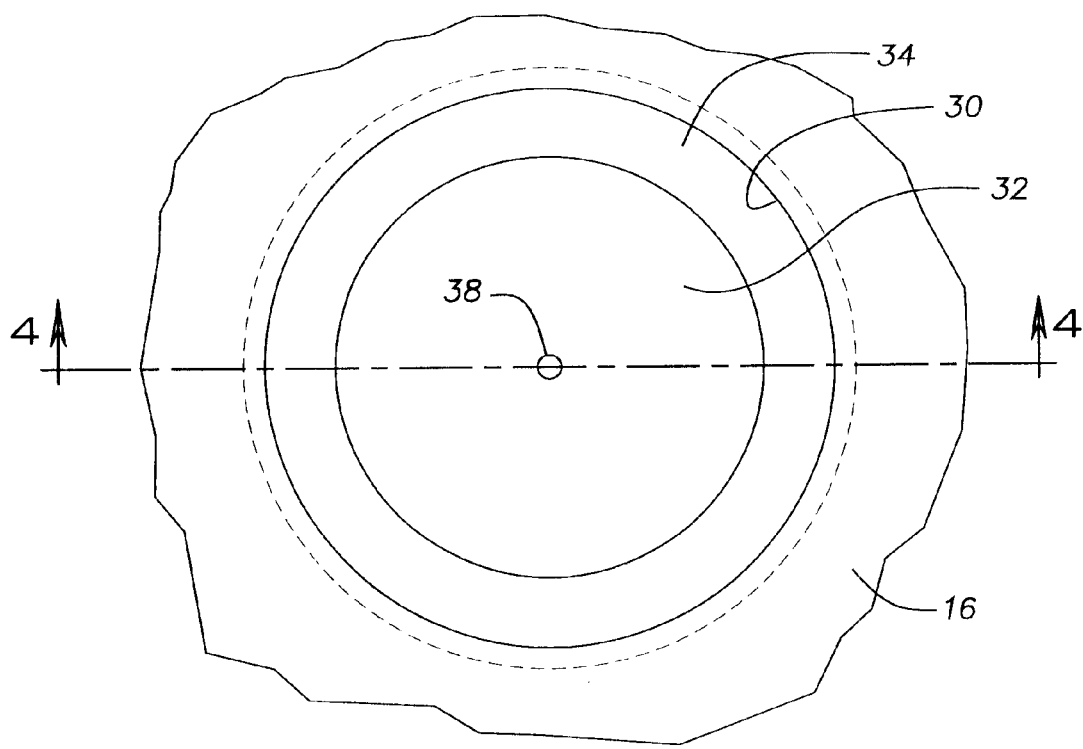
FIG. 3 is a top view of a portion of a heat spreader equipped with an O-ring seal.

At least one hole must be present in one of the heat transfer surfaces in order to fill the cavity. In a first embodiment, the hole 30 is formed in the heat spreader 16 so that it can accommodate an elastomeric O-ring plug 32, as shown in FIGS. 3 and 4. The rim 36 of the hole 30 is semi-circular in cross section to accommodate the circular ring 34 of the plug 32. While an O-ring plug is shown, many other configurations are possible. The plug may have one or more vent holes 38 in one of the surfaces that define the cavity that will hold the liquid metal. As shown in FIG. 3, the liquid metal 18 fills this cavity between the semiconductor chip 14 and the heat spreader 16. The surface tension of the liquid metal 18 prevents any escape of the liquid through the vent hole 38 during filling. Each of the vents 38 can be sealed afterwards with a suitable adhesive, such as a silicone sealant, an epoxy or a rubber plug (not shown).

A portion 28 of the elastomeric plug 32 is easily deformable and of sufficient size to accommodate any volume changes in the liquid metal 18. Ideally, the shrinkage that occurs during solidification of the metal can be accommodated. Solidification of the liquid metal generally proceeds from the periphery towards the center of the cavity; therefore, when a single hole is used, it should be located at the center.

Figure 6:
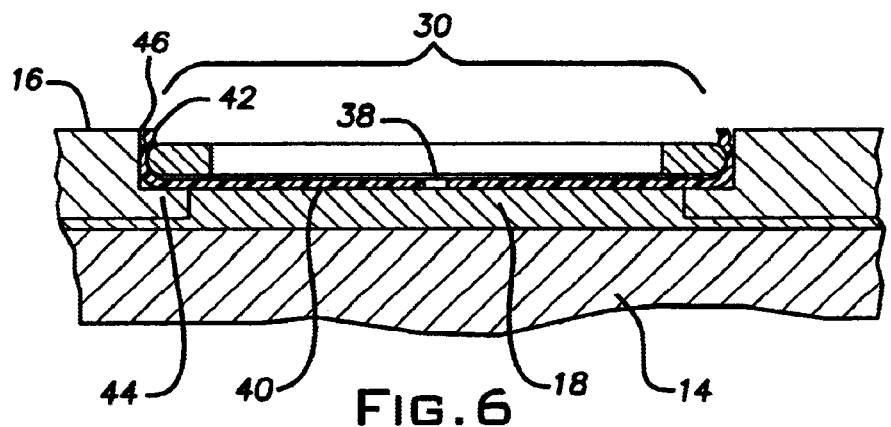
FIG. 6 is a cross sectional view taken along lines 6—6 of FIG. 5.
Figure 5:
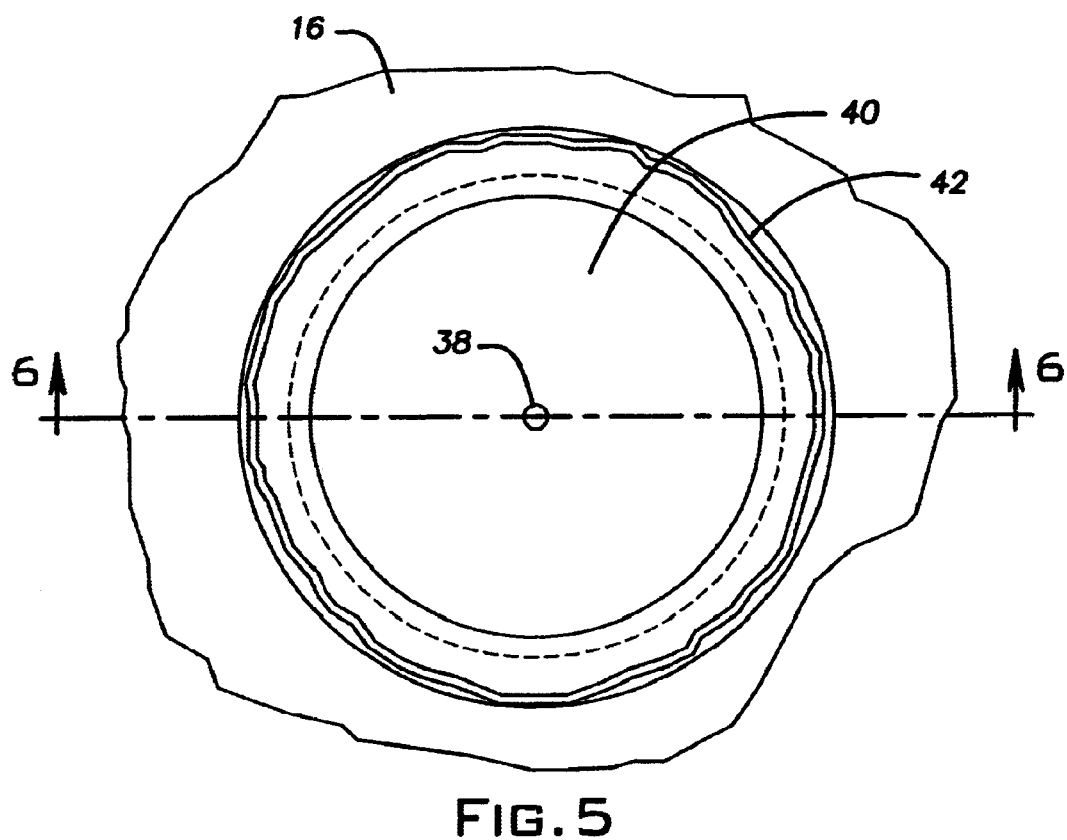
FIG. 5 is a top view of a heat spreader with an alternative seal.

Instead of an O-ring, a flexible membrane 40 may be used to accommodate volumetric changes of the liquid metal and/or changes in the spatial relationship of the opposing surfaces. FIGS. 5 and 6 show a membrane 40 retained in a hole 30 within an O-ring 16 by a flat ring 42. The hole 30 is defined by a lip 44 joined to a shoulder 46. Frictional interference between the ring 42, the membrane 40 and the shoulder 46 securely holds the seal in place. An adhesive may be used in place of, or in addition to, the friction to keep the seal in place. As before, a hole 38 in the membrane is used for filling the confined space between the O-ring 16 and the chip 14 with liquid metal 18.

The cavity can be filled by syringe, followed by degassing in a vacuum. Gallium and its alloys wet glass and silicon, thereby aiding the filling process. After the cavity has been filled, the plug can then be pressed into place. Another method for producing this structure uses the uncured adhesive bead as a dam for containing the liquid metal. Droplets of metal may be placed onto the surface, along with a means to maintain a uniform plate spacing—for example, glass beads. When the second surface is brought into contact with the adhesive, the liquid metal is contained and forced into the vent hole, which is subsequently plugged. Regardless of the filling method, the vent holes can be filled with an uncured polymer. The liquid metal may also be applied to the chip by screening.

Figure 7:
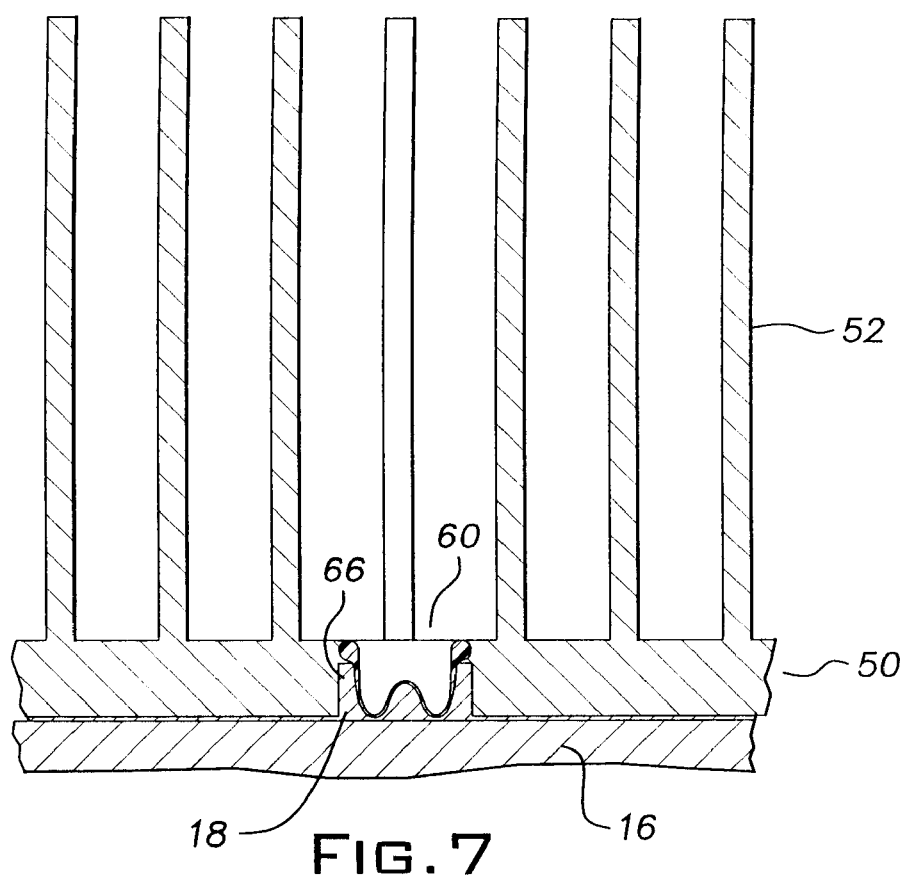
FIG. 7 is an elevational view, partially in cross section, of a heat sink coupled to a heat spreader and including an elastomeric plug.
Figure 8:
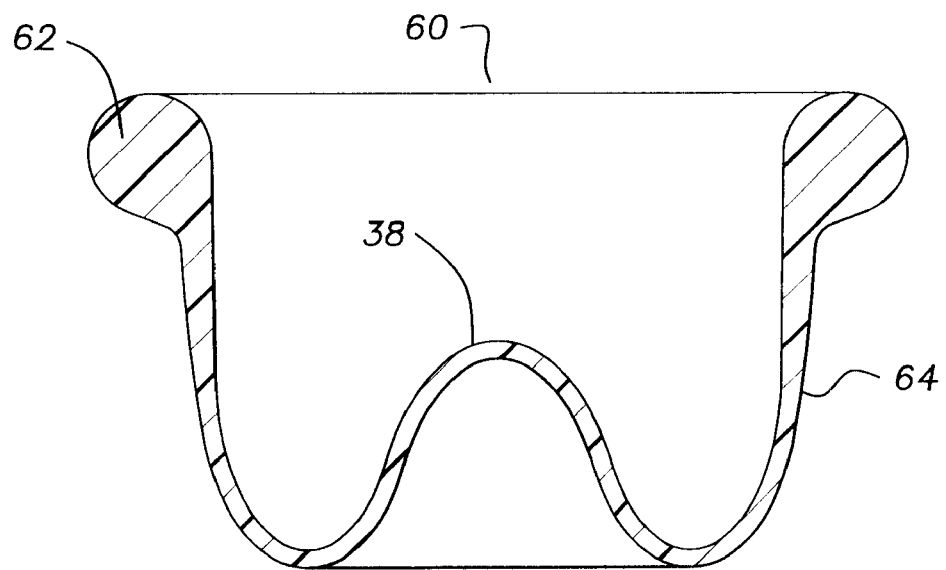
FIG. 8 is an enlarged view of the plug of FIG. 7.

A third type of seal is shown in FIGS. 7 and 8 in an application where a heat sink 50 is attached to a large flat surface of a heat spreader 16. The heat sink includes several cooling fins 52. A peripheral ring of adhesive (not shown) may be used to attach the two heat transfer surfaces, as described above, or a gasket may be used if it is possible to apply a clamping force. A seal 60 is used to allow filling of the cavity and to accommodate thermal expansion. The seal comprises a thickened rim 62 and a thin curvilinear membrane 64 having at least one vent hole 38 for the purposes previously as described. The cavity between the heat spreader 16 and the heat sink 50 including void space 66 surrounding the membrane is filled with liquid metal 18 as previously described. The membrane is shaped to accommodate the expansion and contraction of the liquid metal.

Most heat sinks are extruded aluminum. Aluminum dissolves in gallium and, in the presence of moisture, reacts for form thick oxides. Copper also dissolves in gallium, albeit to a much lesser degree. For these reasons, the preferred material for O-rings is nickel-plated copper, although any impermeable oxide layer can prevent the dissolution of the underlying material. Wetting of the plated nickel surface by the liquid metal can be improved by silane treatment.

EXAMPLE 1

A seal was used to construct a thermal test coupon using Gallinstan alloy. (See Table I). A fast-curing epoxy bead was deposited around the periphery of a one inch square, 88-mil thick, aluminum plate. Droplets of Gallinstan were deposited near the corners of the coupons adjacent to the epoxy bead. Glass particles with a maximum size of eight mils were dropped into each corner. A second plate was positioned and clamped until the epoxy dried. Liquid metal could be observed in the expansion chamber, and a seal, identical to that shown in FIGS. 4 and 5, was fitted into a hole in the second plate. The thermal conductivity was measured under well controlled conditions and found to be >7 W/m-K after the contact area of the liquid metal had been accounted for.

The specific details and operation of the chip, the heat spreader and heat sink described herein, as well as the details of the various passive and active devices that are used in association therewith, are known to persons of ordinary skill in the art. Accordingly, these details do not comprise a part of the present invention, except to the extent that they and their operation have been modified to become part of the present invention. Although the invention has been described in terms of a semiconductor circuitry as being the heat source, it should be understood that other electronic devices, including power supplies, can be cooled in the manner taught by this invention.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A thermal coupling device for facilitating heat transfer between generally parallel surfaces spaced from one another and having a temperature differential therebetween, the two surfaces forming a confined space comprising:
    a) a metal that is liquid over substantially the entire range of temperatures that comprise the temperature differential, occupying the confined space between the two surfaces; and
    b) a seal to contain the liquid metal between the two surfaces, said seal including means for accommodating changes in the distance between the two surfaces, and volumetric changes of the metal, and for eliminating air from the space.

2. The device according to claim 1 wherein the metal is a non-toxic metal selected from the group consisting of gallium and its alloys.

3. The device according to claim 2 wherein the seal comprises a flexible elastomeric or polymeric plug.

4. The device according to claim 3 wherein the seal comprises an O-ring seal that is retained in an annular opening of one of the surfaces.

5. A thermal coupling device for facilitating heat transfer between generally parallel surfaces spaced from one another and having a temperature differential therebetween and an annular opening in one of the surfaces, the two surfaces forming a confined space comprising:
    a) a metal that is liquid over substantially the entire range of temperatures that comprise the temperature differential, occupying the confined space between the two surfaces; and
    b) a seal to contain the liquid metal between the two surfaces, said seal including means for accommodating changes in the distance between the two surfaces and volumetric changes of the metal, and for eliminating air from the space, wherein the seal comprises a flexible elastomeric or polymeric plug composed of a flexible membrane, and a retaining ring used to retain the membrane in said annular opening of one of the surfaces.

6. The device according to claim 5 wherein one of the parallel surfaces comprises a surface of a semiconductor chip and the other of the parallel surfaces comprises a surface of a heat sink or a heat spreader.

7. An electronic structure comprising an integrated circuit associated with a semiconductor chip wherein the chip generates thermal heat when being used, and means for removing the generated heat from an exposed surface of the chip, the heat removing means comprising:
   a) a heat absorber comprising a heat sink or a heat spreader adjacent but spaced a small distance from said exposed surface of the chip;
   b) a non-toxic metal that is liquid over substantially the entire range of temperatures comprising the temperature differential; and
   c) a seal to contain the liquid metal between the two surfaces, said seal including means for accommodating changes in the spacing between the two surfaces and volumetric changes of the metal.

8. The structure according to claim 7 wherein the small spacing between the exposed surface of the chip and the heat absorber is about 0.9 mm.

9. The structure according to claim 7 wherein the seal comprises a flexible elastomeric or polymeric material.

10. A method of transferring heat between two substrates having a ΔT and having generally parallel, opposing, spaced apart surfaces comprising the steps of
    a) confining the space between the two surfaces;
    b) introducing a non-toxic liquid metal into the space between the surfaces and displacing all of the air in the space; and
    c) providing a flexible seal to contain the liquid metal and to permit expansion and contraction of the metal without affecting the spaced relationship of the two substrates.

11. The method according to claim 10 wherein the seal comprises a flexible elastomeric or polymeric material.

12. The method according to claim 11 wherein the non-toxic metal is selected from the group of gallium and its alloys.

13. The method according to claim 12 wherein the seal comprises an O-ring seal that is retained in an annular opening of one of the surfaces.

14. The method according to claim 12 wherein one of the parallel surfaces comprises a surface of a semiconductor chip and the other of the parallel surfaces comprises a surface of a beat sink or a heat spreader.

15. The method according to claim 12 wherein the elastomeric or polymeric material contains at least one vent hole for displacement of the air.

16. The method according to claim 15 wherein at least one vent hole is sealed after the air is displaced.

17. A thermal coupling device for facilitating heat transfer between generally parallel surfaces spaced from one another and having a temperature differential therebetween, the two surfaces forming a confined space, the coupling device comprising:
   a) a metal that is liquid over substantially the entire range of temperatures that comprise the temperature differential, occupying the confined space between the two surfaces; and
   b) a seal to contain the liquid metal between the two surfaces, said seal including means for accommodating changes in the distance between the two surfaces and volumetric changes of the metal, said seal comprising a flexible elastomeric or polymeric plug containing at least one vent hole for eliminating air from the space.

18. An electronic structure comprising an integrated circuit associated with a semiconductor chip wherein the chip generates thermal heat when in use, and means for removing the generated heat from an exposed surface of the chip, the heat removing means comprising:
   a) a heat absorber comprising a heat sink or a heat spreader adjacent to, but spaced a distance of about 0.9 mm from, said exposed surface of the chip;
   b) a metal that is liquid over substantially the entire range of temperatures comprising a temperature differential between the heat generator and the heat remover; and
   c) a seal to contain the liquid metal between the two surfaces, said seal comprising a flexible membrane and a retaining ring used to retain the membrane in an annular opening of one of the surfaces, said seal including means for accommodating changes in the spacing between the two surfaces and volumetric changes of the metal.

19. The structure according to claim 18 wherein the seal comprises an O-ring seal that is retained in an annular opening of one of the surfaces.

20. The structure according to claim 18 wherein one of the parallel surfaces comprises a surface of a semiconductor chip and the other of the parallel surfaces comprises a surface of a heat sink or a heat spreader.

21. The Structure according to claim 18 wherein the elastomeric or polymeric material contains at least one vent hole.

22. A method of transferring heat between two substrates having a ΔT therebetween and having generally parallel, opposing, spaced apart surfaces comprising the steps of
    a) confining the space between the two surfaces;
    b) introducing a liquid metal into the space between the surfaces and displacing all of the air in the space; and
    c) providing a flexible seal to contain the liquid metal and to permit expansion and contraction of said liquid metal without affecting the spaced relationship of the two substrates, wherein the seal comprises a flexible elastomeric or polymeric membrane, and a retaining ring to hold the membrane in an annular opening of one of the surfaces.

* * * * *